METHOD OF PRODUCING INTERFACE-ALLOY EPITAXIAL HETEROJUNCTIONS

Filed Oct. 19, 1964

INVENTOR
ROBERT H. REDIKER
BY,
Edward D. Thomas
AGENT

United States Patent Office 3,351,502

Patented Nov. 7, 1967

3,351,502

METHOD OF PRODUCING INTERFACE-ALLOY EPITAXIAL HETEROJUNCTIONS

Robert H. Rediker, Newton, Mass., assignor to Massachusetts Institute of Technology, Cambridge, Mass., a corporation of Massachusetts Filed Oct. 19, 1964, Ser. No. 404,818
7 Claims. (Cl. 148—177)

ABSTRACT OF THE DISCLOSURE

Single crystal heterojunctions are made by the method of interface alloying in which melting in a controlled atmosphere occurs only at the interface of two dissimilar semiconductor wafers in a 5–20$\mu$ thickness of the lower-melting-point semiconductor and alloying with the higher-melting-point semiconductor takes place as the melted semiconductor recrystallizes at a lowered temperature.

Junctions between two semiconductors of the same element but with different impurities present have been extensively studied and are reasonably understood. Recently, considerable interest has developed concerning junctions between dissimilar semiconductors which are called heterojunctions. The energy band diagrams and the theories of the characteristics n-p, n-n, p-n, and p-p heterojunctions has made such devices appear attractive for a number of practical applications such as, wide band-gap emitters, majority carrier rectifiers, high speed band-pass photo-detectors, beam-of-light transistors, and indirect-gap injection lasers.

Heterojunctions have been prepared by a number of different methods. The germanium-gallium arsenide heterojunction has been made by the vapor deposition of germanium from the iodide. This process is described more fully by R. L. Anderson, I.B.M. Journal Research and Development, 4, p. 283, 1960 and R. L. Anderson, Solid State Electronics 5, p. 341, 1962. Goldstein and Dabin, Solid State Electronics 5, p. 411, 1962 describe a process for making heterojunctions by diffusing phosphorous from its vapor into gallium arsenide. They have also been prepared by the vacuum evaporation of one material on another. Alloyed heterojunctions between germanium and silicon in which the germanium is fully melted have been reported by Wei and Showchun in Proc. I.E.E.E., 51, p. 946, 1963. These various processes are subject to various limitations with respect to pressure, time, freedom from contamination, reproducibility and choice of materials.

It is a primary purpose of the present invention to provide a simple technique to make single crystal junctions between dissimilar crystal materials where only the interface between the two substances is melted.

This is done by placing the faces of appropriately prepared wafers of the two crystals in contact with each other and heating the two wafers in a temperature gradient such that the higher melting substance is at the higher temperature. The temperature is raised until a thin liquid film of the lower melting substance appears at the interface. The temperature is then reduced and the melted film recrystallizes, having alloyed into the higher melting substance. A feature of this invention is that when the technique is carefully executed the melted film regrows as a single crystal on the higher-melting-point crystal surface and thus the heterojunction that is formed is single-crystalline.

The nature of the invention will be more fully understood from the following detailed description and by reference to the accompanying drawings of which:

There are a considerable number of semiconductor materials, particularly among the intermetallic compounds of group III and group V elements, which possess characteristics indicating possible utility in heterojunctions. Table I illustrates the wide choice of materials for this purpose.

TABLE I

| Material | Lattice Spacing | Energy Gap |
|---|---|---|
| SiC | 4.35 | 2.86 |
| BP | 4.537 | 6 |
| ZnS | 5.406 | 3.7 |
| Si | 5.423 | 1.04 |
| GaP | 5.450 | 2.24 |
| AlP | 5.46 | 3.1 |
| AlAs | 5.63 | 2.16 |
| GaAs | 5.653 | 1.38 |
| Ge | 5.653 | 0.63 |
| ZnSe | 5.667 | 2.6 |
| CdS | 5.83 | 2.4 |
| HgS | 5.852 | 2.0 |
| InP | 5.860 | 1.27 |
| PbS | 5.933 | 0.39 |
| CdSe | 6.05 | 1.7 |
| InAs | 6.058 | 0.33 |
| HgSe | 6.034 | 0.6 |
| ZnTe | 6.035 | 2.1 |
| GaSb | 6.095 | 0.68 |
| PbSe | 6.124 | 0.27 |
| AlSb | 6.135 | 1.49 |
| HgTe | 6.429 | 0.02 |
| PbTe | 6.454 | 0.32 |
| InSb | 6.479 | 0.16 |
| CdTe | 6.43 | 1.5 |

Junctions have been fabricated by the following procedure between several pairs of semiconductor materials, among them GaAs-Ge, GaAs-GaSb, GaAs-InAs, GaSb-InSb, GaSb-InAs, GaAs-InSb. Note that single crystalline junctions have been made from couples in which the mismatch in lattice spacing varies from very small (0.1 percent) to quite large (~13 percent).

Before alloying, the materials are oriented, sliced, polished, diced and etched by conventional techniques. The wafers are cut from single crystals to present faces, for example, along the crystal {111} plane.

Figure 1:
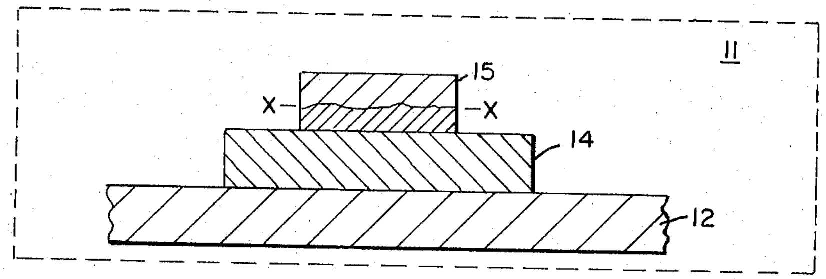
FIGURE 1 is a diagram illustrating the process of the invention.

With reference to FIGURE 1 an enclosure 11 is shown with dotted lines having a heat source 12, illustrated as a carbon heater strip energized from an electrical current source (not shown). The two wafers 14 and 15, are placed on the heater strip with the higher melting point semiconductor wafer 14 between heater strip 13 and the lower melting point semiconductor wafer 15. For a GaAs-Ge heterojunction, germanium with a melting point of 958° C. would be placed above a wafer of gallium arsenide, melting point 1238° C. The alloying is done in a controlled atmosphere, such as a reducing atmosphere of hydrogen or inert nitrogen atmosphere, and under microscopic observation.

The temperature of the heater strip 13 is raised until a 5–20$\mu$ thickness of the lower melting point, material is melted. When melting is observed, the heater strip current is turned off. The melted semiconductor material recrystallizes with interface alloying occurring. The boundary between unmelted and recrystallized regions of wafer 15 is indicated as X—X.

After alloying, ohmic contacts can be made by conventional means; for example, Kovar tabs clad with tin for n-GaAs or clad with Au-Zn for p-GaAs. Leads may be attached and the device attached to any conventional mount.

Metallographic examination between GaAs-Ge, GaAs-GaSb, GaSb-InAs, GaAs-InSb of heterojunctions prepared by this method indicate that the junctions are single-crystal. This indication has been confirmed for GaAs-Ge and GaAs-GaSb heterojunctions by Kossel line techniques using X-ray diffraction by the crystal planes to obtain absorption conics and diffraction conics. If the portion of the sample through which the X-rays pass is a single crystal, a sharp Kossel line pattern is observed. When the X-rays are produced by a 1$\mu$ electron microbeam at an effective point in the heterojunction, sharp Kossel line characteristics of both the Ge and GaAs are observed and such patterns indicate that the junction is a single crystal. The patterns also show that the resultant strain is relieved in a distance of less than 1$\mu$. Kossel line patterns for the GaAs-GaSb couple indicate that the transition region is 1–2$\mu$ thick. Because of the relatively heavy X-ray absorption in antimony, the transmission Kossel patterns of GaBb are relatively weak and there is an apparent broadening of the pattern. If there is a polycrystalline region in the heterojunction, it is much narrower than the 1$\mu$ resolution of the instrument. The observed results are consistent with the heterojunction being a single crystal. A more complete account of this work is found in a paper by Rediker, Stopek and Ward, "Interface-Alloy Epitaxial Heterojunctions," published in Solid State Electronics, vol. 7, pp. 621–629, 1964.

In most cases the crystal faces along which the heterojunction pairs are mated are the same. Junctions have been produced between semiconductor wafers mated along {100}, {110} and {111} crystal planes. Junctions formed by mating (111) faces of pairs of the III–V compound semiconductors pose a particular problem due to the polar nature of these "zinc-blende" semiconductors. Gatos and Lavine, J. Electrochem. Soc., vol. 107, p. 427, 1960, studied the surface characteristics of the {111} crystallographic planes of such compounds. The polarity leads to a pronounced physical chemical difference between surfaces terminating with group III atoms, called A{111} surface, and those terminating with group V atoms, called B{111} surface. For example, the A{111} surfaces develop etch pits in oxidizing etchants whereas B{111} surfaces do not. In making junctions by the present process usually the A{111} surface is mated with a B{111} surface.

When the molten surface of wafer 15 recrystallizes on the surface of wafer 14, it follows the orientation of the higher melting seed. Thus if the semiconductors are mated with a crystal plane orientation mismatch or if A{111} and A{111} or B{111} and B{111} faces are mated there will be a discontinuity in orientation in the recrystallized region. This discontinuity does not occur at the interface between the two semiconductors—the heterojunction is single crystal and in series with it there is an orientation-junction in the recrystallized material, or at the boundary of the recrystallized region and its parent material labeled X—X in FIGURE 1. Interface-alloy heterojunctions with orientation discontinuities are considered to result from the very short time of recrystallization which does not permit equilibrium conditions to be reached.

Interface alloying of a variety of semiconductors has for each case yielded reproducible results. While the electrical properties of any given heterojunction couple are reproducible, these properties for the different heterojunction couples, however, may be different. To illustrate by way of example, there follows the results of two systems namely GaAs-GaSb and GaAs-InSb in which the orientation of the two semiconductors of the pair were matched.

Figure 2:
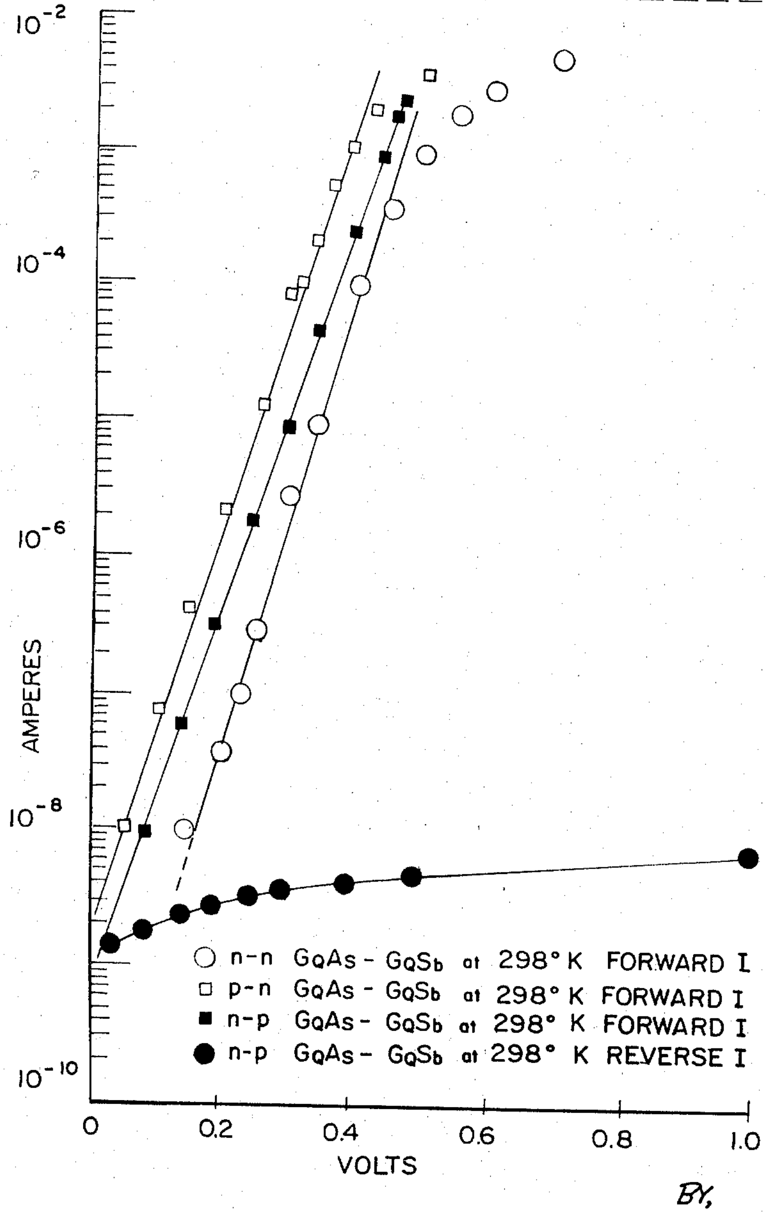
FIGURE 2 is a graph of the current-voltage characteristics of certain heterojunctions.

For the GaAs-GaSb heterojunctions, all four combinations of conductivity types of GaAs and GaSb were used. Forward conduction occurred when the n-GaAs was biased negatively or when the p-GaAs was biased positively. The rectification ratio of the p-p diodes, however, was very poor. In FIGURE 2 the forward I–V characteristics at 298° K. are shown for the n-p, p-n and n-n junctions. The reverse I–V characteristic at 298° K. of the n-p junction is also shown. If the forward characteristics of these junctions are investigated as a function of temperature, the forward current for all three heterojunctions is found to vary as $I_f = I_0$ exp. (AV) where A is relatively independent of temperature.

Table II is a tabulation of data taken at six different temperatures for GaAs-GaSb heterojunctions of n-p, p-n and n-n types respectively.

TABLE II

[Values of A assuming $I = I_0$ exp. (AV) and $n$ assuming $I = I_0$ exp. ($qV/nkT$) for GaAs-GaSb n-p, p-n, n-n heterojunctions respectively.]

| T (° K.) | n-p Heterojunction | | p-n Heterojunction | | n-n Heterojunction | |
|---|---|---|---|---|---|---|
| | A | n | A | n | A | n |
| 77 | 33 | 4.5 | 37 | 4.1 | 43 | 3.5 |
| 190 | 32 | 1.91 | 30 | 2.06 | 35 | 1.75 |
| 298 | 31 | 1.25 | 34 | 1.16 | 37 | 1.05 |
| 330 | ------ | ------ | 34 | 1.02 | ------ | ------ |
| 350 | 30 | 1.10 | 34 | 0.97 | ------ | ------ |
| 370 | 30 | 1.04 | 34 | 0.91 | ------ | ------ |
| 400 | 32 | 0.91 | ------ | ------ | ------ | ------ |

Note the values of $n$ at the higher temperatures are less than unity. Such values of $n$ indicate that the current transport across the junction is not a thermal mechanism. The relative temperature invariance of the quantity A is consistent with the current being due to a tunneling mechanism. These current-voltage characteristics, reverse capacitance data, and electro-optical results indicate that in the GaAs-GaSb interface alloy heterojunction there is a barrier to current flow in the conduction band at the interface between the two semiconductors and that current flow is predominantly by tunneling through this barrier.

The GaAs-InSb heterojunction couple which has been investigated by the interface alloy process is distinctive because of the large melting point difference (1235° C. versus 525° C.), large bandgap ratio (8.6 at 298° K.) and large lattice mismatch (13.6%). In spite of the large differences in these properties of the two materials, in interface alloying the heterojunction is single crystalline. Measurements of the I–V characteristics of these junctions show that the GaAs-InSb, n-n, n-p, and p-p junctions are forward biased when the InSb is positive while the p-n junction shows negligible rectification. If the forward characteristics of the n-n, n-p and p-p junctions are investigated as a function of temperature, the forward current is found to vary as $I_f = I_0$ exp. ($qV/nkT$), where $n$ is larger than unity at temperatures below room temperature (298°), but approaches and never gets smaller than unity as the temperature is increased above room temperature. The current voltage characteristics, reverse capacitance data and electro-optical results indicate that in GaAs-InSb interface alloy heterojunction that there is a barrier to current flow in the conduction band at the interface between the two semiconductors, and that, while the current flow at low temperatures is predominantly by tunneling through the barrier, at higher temperatures thermal injection of carriers over the barrier becomes important.

Epitaxial heterojunctions as mentioned earlier in this application have many proposed practical applications. Interface alloying makes the fabrication of these junctions simple and reproducible enough so the vast potentialities of these may be realized. For example, the GaAs-InSb n-n heterojunctions produced by this technique are, as described above, majority carrier rectifiers in which the barrier in the conduction band limits the current flow. These junctions seem to offer advantages in ease of fabrication, reproducibility and consequent cost over the presently fabricated metal-semiconductor majority carrier rectifiers, and equal or exceed the desired electrical characteristics of the metal-semiconductor rectifiers i.e., speed and rectification ratio.

The process described above produces single crystal heterojunctions in an extremely simple technique. In the interface alloying, single crystal regrowth seems to be the preferred and hence the lowest energy method for regrowing. It is especially noted that the process does not seem to require a close match of crystal lattice spacing constants for single crystal regrowth and the respective melting points of the dissimilar semiconductor materials are not critical. Consequently, the process is also well adapted for the fabrication of single crystal junctions between a metal and a semiconductor.

Further, since the operation of the process is not dependent on the use of particular semiconductor materials, the choice of materials is not limited to the specific examples which have been selected by way of examples to illustrate the manner of practicing the present invention.

What is claimed is:

1. The method of producing single crystal epitaxial junctions between dissimilar crystalline materials comprising the steps of, preparing paired wafers from dissimilar crystals cut to present surfaces oriented along crystallographic planes, supporting the lower melting wafer on the higher melting wafer in a controlled atmosphere, heating the higher melting wafter to melt the surface of the lower melting wafer, reducing the temperature to avoid further melting of said lower melting wafer and permitting recrystallization of the melted portion following the orientation of the higher melting wafer.

2. The method of interface alloying of dissimilar crystalline materials comprising the steps of, preparing paired wafers from dissimilar crystals having different melting points by cutting said crystals to present surfaces oriented along the same crystallographic planes, supporting the lower melting wafer on the higher melting wafer in an inert atmosphere, establishing a temperature gradient such that melting of the lower melting wafer begins at the common interface, reducing the temperature before further melting occurs to a temperature level at which the melted portion recrystallizes following the orientation of the higher melting wafer surface.

3. The method of producing single crystal epitaxial junctions between dissimilar semiconductor crystals comprising the steps of, mating semiconductor wafers cut from different semiconductor materials oriented to present surfaces in crystallographic planes, melting the surface of the lower melting wafer at the common interface in a controlled atmosphere and reducing the temperature before the entire lower melting wafer melts to a temperature level at which the melted portion recrystallizes following the orientation of the higher melting wafer.

4. The method of producing single crystal epitaxial heterojunctions by interface alloying comprising the steps of preparing paired wafers from dissimilar semiconductor crystals cut to present surfaces oriented in the same crystallographic planes, placing the wafer surfaces in contact with each other in a controlled atmosphere, the higher melting wafer supporting the lower melting wafer, establishing a temperature gradient such that the higher melting wafer is at the higher temperature, raising the temperature until the lower face of the lower melting wafer begins to melt, lowering the temperature before the entire lower melting wafer can melt to a level at which the melted portion recrystallizes following the orientation of the higher melting surface having alloyed into the surface thereof.

5. The method of interface alloying of intermetallic compounds to produce single crystal junctions between dissimilar semiconductors comprising the steps of, preparing paired wafers from dissimilar semiconductor crystals having different melting points by cutting said crystals to present wafer surfaces oriented in the same crystallographic planes, placing paired wafers in a controlled atmosphere on a heater so the lower melting wafer is supported by the higher melting wafer, establishing a temperature gradient such that the higher melting wafer is at the higher temperature and the lower surface of the lower melting wafer starts to melt, reducing the temperature to prevent further melting of the lower melting wafer and to permit recrystallization of the melted portion with alloying into the higher melting wafer at the interface.

6. The method of interface alloying of intermetallic compounds to produce single crystal junctions between dissimilar semiconductors comprising the steps of, preparing paired wafers from dissimilar semiconductor crystals having different melting points by cutting said crystals to present wafer surfaces oriented in the same crystallographic planes, placing paired wafers in an inert atmosphere on a heater so the lower melting wafer is supported by the higher melting wafer, establishing a temperature gradient such that the higher melting wafer is at the higher temperature and the lower surface of the lower melting wafer starts to melt, reducing the temperature to prevent further melting of the lower melting wafer and to permit recrystallization of the melted portion with alloying into the higher melting wafer at the interface.

7. The method of interface alloying of intermetallic compounds to produce single crystal junctions between dissimilar semiconductors comprising the steps of, preparing paired wafers from dissimilar semiconductor crystals having different melting points by cutting said crystals to present wafer surfaces oriented in the same crystallographic planes, placing paired wafers in a reducing atmosphere on a heater so the lower melting wafer is supported by the higher melting wafer, establishing a temperature gradient such that the higher melting wafer is at the higher temperature and the lower surface of the lower melting wafer starts to melt, reducing the temperature to prevent further melting of the lower melting wafer and to permit recrystallization of the melted portion with alloying into the higher melting wafer at the interface.

References Cited

UNITED STATES PATENTS

| | | | |
|---|---|---|---|
| 3,057,762 | 10/1962 | Gans | 148—177 |
| 3,290,188 | 12/1966 | Ross | 148—177 |

DAVID L. RECK, *Primary Examiner.*

RICHARD O. DEAN, *Examiner.*